Nov. 7, 1961

W. B. ELLWOOD 3,007,855

RHODIUM PLATING

Filed Dec. 29, 1958

INVENTOR
W. B. ELLWOOD
BY George S. Indig
ATTORNEY 3,007,855

RHODIUM PLATING

Walter B. Ellwood, New York, N.Y., assignor to Bell Telephone Laboratories, Incorporated, New York, N.Y., a corporation of New York Filed Dec. 29, 1958, Ser. No. 783,512
7 Claims. (Cl. 204—37)

This invention relates to methods of rhodium plating iron-containing substrate materials and to products so formed.

Rhodium has long been recognized and used as an excellent contact material for electrical switches and the like due to its excellent hardness. The material is preferable to platinum for certain purposes by reason of its lower resistivity and somewhat higher melting point and to gold because of its greater covering power, hardness and much higher melting point. The common procedure is to plate rhodium onto the desired substrate material by electrolytic deposition from a rhodium plating solution in which the substrate material is made cathodic. Many switch configurations, however, desirably make use of iron or iron-containing alloys in contact elements. A common type of switch requiring such material is the magnetically activated sealed wire contact switch described in United States Patent 2,506,414. In the plating of rhodium on iron or iron-containing substrates containing at least 18 percent by weight iron, it is considered necessary to use an intermediary nickel layer to prevent attack of the iron-containing substrates by the commonly used rhodium plating solutions, such attack resulting in poor adhesion of the rhodium to the substrate leaving a rough, porous rhodium plated surface and contaminating the rhodium plating solution.

In addition to being unwieldy due to the necessity of using an intermediary nickel layer, this process suffers the further drawback of poor adhesion between the rhodium and the substrate when a relatively thick layer of rhodium is plated onto the substrate.

In accordance with the present invention, a process is described by the use of which rhodium can be electrolytically plated directly onto an iron-containing substrate thereby obviating the necessity of an intermediary nickel layer. Further, this process permits the plating of relatively thick rhodium layers onto the substrate, having good adhesion thereto. More particularly, in accordance with the methods of this invention, rhodium is plated onto an iron-containing substrate by first electroplating a thin continuous layer of rhodium onto the substrate material and then heating the plated substrate to cause a partial diffusion between the rhodium plate and the substrate. A second layer of rhodium is then electroplated onto the substrate. The partial diffusion forms an adherent bond between the substrate surface and the rhodium layer and, in addition, presents a more noble surface than, for example, nickel, on which the second rhodium layer is to be plated. Etching of the substrate by the plating solution is minimized and the plating bond to the second rhodium plate is improved.

A more complete understanding of the features of this invention together with additional objects thereof may be gained from the following description in conjunction with the accompanying drawings, in which.

Figure 1:
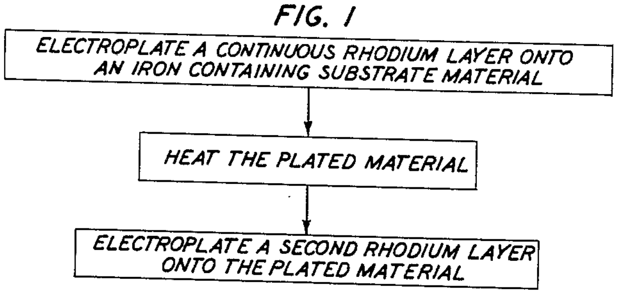
FIG. 1 is a flow diagram representing a method of this invention.

Referring to FIG. 1, a rhodium plate on an iron-containing substrate material is formed by the method illustrated by this flow chart. Examples of useful iron-containing substrate materials which are advantageously plated in accordance with this invention are "Kovar" having a composition of 54 percent by weight iron, 31 percent by weight nickel and 15 percent by weight cobalt, "Permivar" having a composition of 45 percent by weight nickel, 25 percent by weight cobalt and 30 percent by weight iron, and a nickel-iron alloy containing 51 percent by weight nickel and 49 percent by weight iron as well as iron itself.

Before processing, the substrate material may be given a preliminary heat treatment in hydrogen or any other commercial bright annealer to reduce any oxides on the surface, for example, by heating in hydrogen at 1000° C. for one-half hour. The substrate material is then made cathodic in any of the well known rhodium plating baths. In general, the preferred commercial plating solutions are of the acid type containing soluble salts of rhodium. Examples include acetic solutions of rhodium sulfate and rhodium phosphate. Typical acid media are sulfuric acid and phosphoric acid.

The salt concentration is arbitrary with the upper limit dependent primarily on the solubility of the rhodium salt. A concentration of two to ten grams of rhodium sulfate per liter of a sulfuric acid solution has proven satisfactory. It is advantageous to plate as rapidly as possible to minimize attack of the substrate by the plating solution. It is well known that the plating rate can be increased by increasing the concentration of the rhodium salt in solution. However, when the upper solubility limit of the rhodium salt is approached, likelihood of etching of the substrate material by the plating solution increases, due to the increased concentration of the active salt radical, such as the sulfate radical. Accordingly, the other plating parameters such as solution temperature and current density should be adjusted so as to give a rapid plating rate.

The acid concentration of the solution is not critical and can range from, for example, 10 cubic centimeters per liter upwards for either sulfuric or phosphoric acid. Appreciably higher acid concentrations tend to lower the cathode efficiency slightly. Bath temperatures of from 20 degrees centigrade to 45 degrees centigrade are conventionally used since such temperatures are easy to work with. However, since the plating rate can be increased by increasing the solution temperature, it may be desirable to use more elevated temperatures. Current density is critical only in that it should be low enough to preclude rapid depletion of the rhodium from the neighborhood of the cathode and consequent subsequent rapid hydrogen liberation at the cathode. As is well known, such rapid liberation may impair adhesion of the rhodium plate to the substrate material. Since the current density is a function of solution temperature and rhodium ion concentration, it is within the purview of those skilled in the art to determine a suitable density. The maximum current density may be determined visually by the rapid evolution of hydrogen bubbles. Current densities ranging from 10 amperes per square foot to 100 amperes per square foot have proven satisfactory. Insoluble anodes such as platinum, lead and carbon are used so as to prevent contamination of the plating solution.

Plating continues until the substrate surface exhibits a continuous rhodium layer. Measurements made on the rhodium layer deposited in this manner indicate thicknesses of from 0.5 milligram per square inch to 3.5 milligrams per square inch (5 microinches to 20 microinches). Etching of the substrate is minimized by the comparatively short time required to lay down such a thin layer. Substantially greater thicknesses impair adhesion of the final rhodium plate.

The plated substrate is then withdrawn from the plating solution and after washing to remove the plating salts is then heated to cause a partial mutual diffusion of rhodium and the substrate material. It is desirable to heat the substrate in an inert atmosphere such as hydrogen, nitrogen and argon to prevent oxide formation. Heating the plated susbtrate in hydrogen for from five to thirty minutes at from 700° C. to 1100° C. has proven satisfactory. Undue prolongation of such times and temperatures does not aid the diffusion and there is the danger that extreme prolongation may result in complete diffusion of the substrate material into the rhodium layer thereby impairing subsequent rhodium plating.

The substrate is then made cathodic in the same rhodium plating solution previously described or in a fresh solution and rhodium is plated onto the wires at the same current densities as previously described. Again, such current densities are critical only in that hydrogen should not be evolved at a rapid rate at the cathode. Plating is continued until the desired thickness of deposited rhodium is obtained. The thickness of the deposited rhodium is not critical. A rhodium thickness of up to 14 milligrams per square inch (80 microinches) has been achieved with good adhesion.

Figure 2:
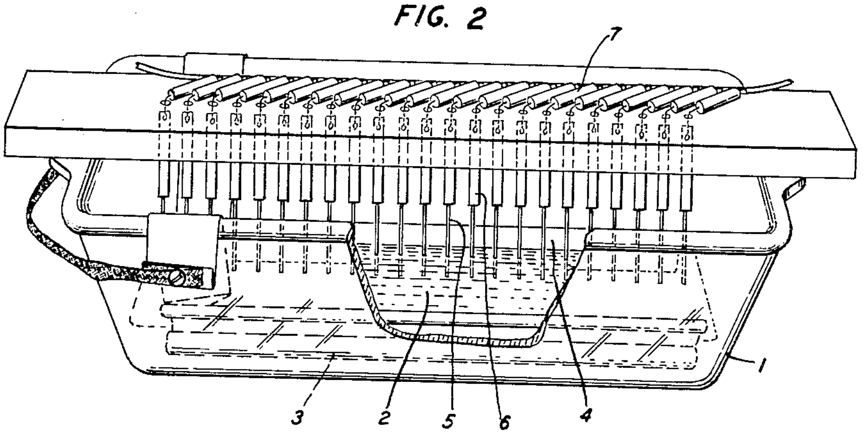
FIG. 2 is a side elevational view of apparatus suitable for use in practicing this invention.

Referring now to FIG. 2, there is seen a plating apparatus which includes a Pyrex dish 1 holding a rhodium plating solution 2. Platinum anodes 3 and 4 have a total surface area of approximately 27 square inches. Wires 5, having a surface area of 0.288 square inch and a composition of 51 percent by weight nickel and 49 percent by weight iron, are biased cathodically and held in a fixed relationship in solution 2 by means of springs 6. Each wire is connected in series with a 100-ohm resistance 7 to insure equal amounts of rhodium plating on the surfaces thereof.

Figure 3:
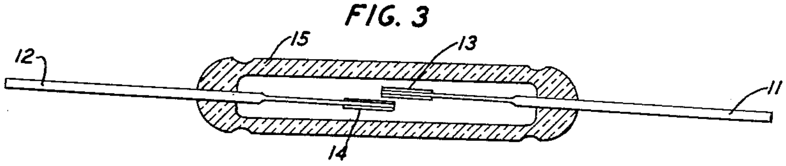
FIG. 3 is a diagrammatic sectional view of a switch utilizing rhodium plated contacts prepared by a method of this invention.

Referring to FIG. 3, there is seen a sealed wire contact device which is described in United States Patent 2,506,414. This device includes wires 11 and 12 having a composition of 51 percent by weight nickel and 49 percent by weight iron. On the surface of each wire is a rhodium layer 13 and 14 formed by methods of this invention. Glass tube 15 encloses a portion of each wire 11 and 12.

A specific example of a procedure for making a sealed reed switch utilizing rhodium contacts formed by the above described process is as follows. Twenty wires having a composition of 51 percent by weight nickel and 49 percent by weight iron, each having a circumference of 45 mils and a total surface area to be plated of 12,000 square mils, were made cathodic in the apparatus described in conjunction with FIG. 2. Rhodium was plated on the wires from a rhodium sulfate plating solution comprising two grams of rhodium, 20 milliliters of sulfuric acid and 980 milliliters of water. Plating continued for twenty-four minutes at a current density of 100 milliamperes per square inch until 0.5 milligram per square inch of rhodium was deposited on each wire. The plated wires were then removed from the solution and heated in a hydrogen atmosphere for fifteen minutes at 1000° C. Next, a second rhodium plating was deposited on the wires using the apparatus mentioned previously. A fresh rhodium plating solution similar to that detailed above was used. Plating continued for forty-eight minutes at a current density of 100 milliamperes per square inch until 1.2 milligrams per square inch of rhodium was deposited on each wire. The wires were then assembled in a sealed wire contact device by methods described in United States Patent 2,506,414.

Before the switches were put into use they were operated electromechanically with a 60-cycle coil current for about one hour or approximately 500,000 operations. This repetitive impact produces an increase in the mating area of the contact and increases the local density of the plate. The fact that the rhodium plate did not strip off during this operation is indicative of the excellent adhesion of the rhodium to the substrate material.

What is claimed is:

1. A method of rhodium plating substrate materials containing from 18 percent iron to 100 percent iron by weight which comprises electroplating a continuous rhodium layer having a thickness of 0.5 milligrams per square inch to 3.5 milligrams per square inch directly onto the substrate material, heating the plated substrate to cause diffusion of rhodium into the substrate material, and electroplating a second rhodium layer onto the substrate.

2. A method in accordance with claim 1 wherein said first and said second rhodium layers are electroplated onto the substrate at a current density varying from 10 amperes per square foot to 100 amperes per square foot.

3. A method in accordance with claim 1 wherein electroplating takes place in a solution comprising a soluble rhodium salt dissolved in an acid solution.

4. A method in accordance with claim 3 wherein a sulfuric acid solution having a rhodium sulfate concentration of from two to ten grams per liter of solution is used.

5. A method in accordance with claim 1 wherein the plated substrate is heated in a neutral atmosphere at a temperature of from 700° C. to 1100° C. for five to thirty minutes.

6. A method of rhodium plating substrate materials having the composition 51 percent by weight nickel and 49 percent by weight iron which comprises, electroplating a continuous rhodium layer having a thickness of 0.5 milligram per square inch to 3.5 milligrams per square inch directly onto the substrate material from an aqueous plating solution containing a soluble rhodium salt dissolved in an acid solution at a current density of from 10 to 100 amperes per square foot, heating the plated substrate in a neutral atmosphere for at least fifteen minutes at at least 700° C., and electroplating a second rhodium layer onto the substrate material using the same conditions of the first electroplating step.

7. A method of making a sealed wire contact device which comprises electroplating a continuous rhodium layer having a thickness 0.5 milligram per square inch to 3.5 milligrams per square inch directly onto two wires containing from 18 percent iron to 100 percent iron by weight from a plating solution containing a soluble rhodium salt dissolved in an acid solution at a current density of 10 amperes per square foot to 100 amperes per square foot, heating the plated wires in a neutral atmosphere for at least fifteen minutes at at least 700° C., electroplating a second rhodium layer onto the plated wires using the same conditions of the first electroplating step, and assembling the wires in a sealed wire contact device.

References Cited in the file of this patent

UNITED STATES PATENTS

| | | |
|---|---|---|
| 1,949,131 | Shields | Feb. 27, 1934 |
| 2,506,414 | Ellwood | May 2, 1950 |
| 2,616,840 | Levi | Nov. 4, 1952 |
| 2,778,786 | Pearlman et al. | Jan. 22, 1957 |

FOREIGN PATENTS

| | | |
|---|---|---|
| 473,479 | Great Britain | Oct. 11, 1937 |